United States Patent
Kitazaki et al.

(10) Patent No.: US 9,807,916 B2
(45) Date of Patent: Oct. 31, 2017

(54) CIRCUIT MODULE AND METHOD OF PRODUCING THE SAME

(71) Applicant: Taiyo Yuden Co., Ltd., Tokyo (JP)

(72) Inventors: Kenzo Kitazaki, Tokyo (JP); Masaya Shimamura, Tokyo (JP); Eiji Mugiya, Tokyo (JP); Takehiko Kai, Tokyo (JP)

(73) Assignee: Taiyo Yuden Co., Ltd. (JP)

( * ) Notice: Subject to any disclaimer, the term of this patent is extended or adjusted under 35 U.S.C. 154(b) by 388 days.

(21) Appl. No.: 14/090,534

(22) Filed: Nov. 26, 2013

(65) Prior Publication Data
US 2015/0070851 A1  Mar. 12, 2015

(30) Foreign Application Priority Data

Sep. 12, 2013 (JP) ................................ 2013-189168

(51) Int. Cl.
*H05K 9/00* (2006.01)
*H01L 23/00* (2006.01)
(Continued)

(52) U.S. Cl.
CPC ......... *H05K 9/0015* (2013.01); *H01L 21/561* (2013.01); *H01L 23/3121* (2013.01);
(Continued)

(58) Field of Classification Search
CPC ............................ H05K 9/0015; H01L 21/561
See application file for complete search history.

(56) References Cited

U.S. PATENT DOCUMENTS 6,140,575 A * 10/2000 Gunten ............... H05K 9/0045
174/363
2005/0084989 A1* 4/2005 Wakabayashi ...... H01L 23/3114
438/14
(Continued)

FOREIGN PATENT DOCUMENTS

JP  2006-294701 A  10/2006
JP  2010-225620 A  10/2010
JP  2012-019091 A   1/2012

OTHER PUBLICATIONS

Office Action issued in corresponding Japanese Application No. 2013-192713 dated Jan. 7, 2014 and English translation of the same (2 pages).

*Primary Examiner* — David M Sinclair
*Assistant Examiner* — Robert Brown
(74) *Attorney, Agent, or Firm* — Fitch Even Tabin & Flannery LLP

(57) ABSTRACT

A circuit module includes a wiring substrate having a mount surface, a conductor pattern, and an insulating protective layer, the mount surface having first and second areas, the conductor pattern being formed along a boundary between the first and second areas on the mount surface, the insulating protective layer being formed on the mount surface, the insulating protective layer covering the mount surface and the conductor pattern; a plurality of electronic components mounted on the first and second areas; an insulating sealing layer having a trench, the insulating sealing layer covering the plurality of electronic components, the trench having a depth such that the trench penetrates the protective layer to reach a surface of the conductive pattern; and a conductive shield having first and second shield portions, the first shield portion covering an outer surface of the sealing layer, the second shield portion being electrically connected to the conductor pattern.

7 Claims, 10 Drawing Sheets

(51) Int. Cl.
*H05K 3/30* (2006.01)
*H01L 23/31* (2006.01)
*H01L 21/56* (2006.01)
*H01L 23/552* (2006.01)
*H01L 23/29* (2006.01)
*H01L 25/065* (2006.01)

(52) U.S. Cl.
CPC ............ H01L 23/552 (2013.01); H01L 24/97 (2013.01); H05K 3/301 (2013.01); *H01L 23/295* (2013.01); *H01L 24/16* (2013.01); *H01L 24/32* (2013.01); *H01L 24/48* (2013.01); *H01L 24/83* (2013.01); *H01L 25/0655* (2013.01); *H01L 2224/16225* (2013.01); *H01L 2224/32225* (2013.01); *H01L 2224/48227* (2013.01); *H01L 2224/83851* (2013.01); *H01L 2224/97* (2013.01); *H01L 2924/00014* (2013.01); *H01L 2924/12042* (2013.01); *H01L 2924/1461* (2013.01); *H01L 2924/15159* (2013.01); *H01L 2924/15192* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *Y10T 29/49146* (2015.01)

(56) References Cited

U.S. PATENT DOCUMENTS

| | | | |
|---|---|---|---|
| 2006/0186519 A1* | 8/2006 | Inoue | H01L 24/11 257/678 |
| 2012/0000699 A1* | 1/2012 | Inoue | H01L 23/29 174/257 |
| 2012/0008288 A1* | 1/2012 | Tsukamoto | H05K 9/0037 361/736 |
| 2012/0140423 A1* | 6/2012 | Fisher, Jr. | H05K 3/284 361/748 |
| 2015/0043189 A1* | 2/2015 | Kitazaki | H01L 23/3121 361/816 |

* cited by examiner

CIRCUIT MODULE AND METHOD OF PRODUCING THE SAME

CROSS-REFERENCE TO RELATED APPLICATION

This application claims priority under 35 U.S.C. §119 to Japanese Patent Application No. JP 2013-189168 filed on Sep. 12, 2013, the entire content of which is hereby incorporated herein by reference in its entirety.

FIELD

The present disclosure relates to a circuit module having an electromagnetic shielding function and a method of producing the circuit module.

BACKGROUND

A circuit module in which a plurality of electronic components are mounted on a substrate, which is installed in various electronic apparatuses, has been known. In general, such a circuit module employs a configuration that has an electromagnetic shielding function to prevent an electromagnetic wave from leaking to the outside of the module and entering from the outside.

Furthermore, with diversification and high-functionalization of the electronic components mounted in the circuit module, various measures for preventing the electronic components from electromagnetically interfere with each other have been proposed. For example, Japanese Patent Application Laid-open No. 2010-225620 describes a circuit module in which a slit penetrating a mold resin layer to reach a circuit substrate is formed between two electronic components on the circuit substrate and the slit is filled with conductive resin. Moreover, Japanese Patent Application Laid-open No. 2012-019091 describes a module in which a shield conductor wall between circuit blocks is formed of a plurality of conductor components mounted on a circuit substrate or of a conductor paste or conductor paint filled in a groove formed in mold resin.

SUMMARY

In the configuration described in Japanese Patent Application Laid-open No. 2010-225620, however, because the slit penetrating the mold resin layer is formed by a dicing process, the shape of the slit is limited to a linear shape and it may be impossible to form a curved or branched slit. The shape of an inner shield and the mounting layout of components are limited. Furthermore, because it may be impossible to control the depth of the slit with a high accuracy in the dicing process, it is difficult to electrically connect the bottom of the slit and a wiring layer located immediately below the slit.

On the other hand, in the configuration described in Japanese Patent Application Laid-open No. 2012-019091, because the shield conductor wall is formed of the plurality of conductor components mounted on the circuit substrate, it may be impossible to suppress the increase in the production cost due to increase in the number of components and the number of mounting man-hours.

Moreover, Japanese Patent Application Laid-open No. 2012-019091 describes that the groove to be filled with a conductor paste or conductor paint is formed by laser processing of mold resin. In general, as a material forming the mold resin layer, epoxy resin is used as matrix resin and a silica filler is used as a filler for reducing linear expansion. In the case where a groove is formed in such a mold resin layer by laser cutting, the silica filler in the resin is molten by the laser ablation for form glass, and the glass reattaches the inside of the groove. Therefore, even if a conductive paste is filled in the groove, it may be impossible to ensure a favorable shielding function in some cases because the electrical connection with the wiring pattern located immediately below the groove is inhibited.

In view of the circumstances as described above, it is desirable to provide a circuit module with a high degree of freedom of designing of the shield shape, which is capable of ensuring electrical connection between the wiring layer and the shield, and a method of producing the circuit module.

According to an embodiment of the present disclosure, there is provided a circuit module including a wiring substrate, a plurality of electronic components, an insulating sealing layer, and a conductive shield.

The wiring substrate has a mount surface, a conductor pattern, and an insulating protective layer, the mount surface having a first area and a second area, the conductor pattern being formed along a boundary between the first area and the second area on the mount surface, the insulating protective layer being formed on the mount surface, the insulating protective layer covering the mount surface and the conductor pattern.

The plurality of electronic components are mounted on the first area and the second area.

The insulating sealing layer has a trench, the insulating sealing layer covering the plurality of electronic components, the trench having a depth such that the trench penetrates the protective layer to reach a surface of the conductive pattern.

The conductive shield has a first shield portion and a second shield portion, the first shield portion covering an outer surface of the sealing layer, the second shield portion being electrically connected to the conductor pattern.

Moreover, according to an embodiment of the present disclosure, there is provided a method of producing a circuit module including preparing a wiring substrate on which a conductor pattern is formed on a mount surface having a first area and a second area, the conductor pattern being formed along a boundary between the first area and the second area.

A protective layer is formed on the mount surface, the protective layer including an insulating material, the protective layer covering the mount surface and the conductor pattern.

A plurality of electronic components are mounted on the first area and the second area.

A sealing layer is formed on the mount surface, the sealing layer including an insulating material, the sealing layer covering the plurality of electronic components.

By applying a laser beam to a surface of the sealing layer, a trench having a depth such that the trench penetrates the protective layer to reach a surface of the conductive pattern is formed.

A conductive shield is formed by filling conductive resin in the trench and covering an outer surface of the sealing layer with the conductive resin.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIG. 5A is a plan view showing a process of arranging electronic components, and FIG. 5B is a cross-sectional view of a main portion thereof;

FIG. 6A is a plan view showing a process of forming a sealing layer, and FIG. 6B is a cross-sectional view of a main portion thereof;

FIG. 7A is a plan view showing a half-cutting process, and FIG. 7B is a cross-sectional view of a main portion thereof;

FIG. 8A is a plan view showing a process of forming a trench, and FIG. 8B is a cross-sectional view of a main portion thereof;

FIG. 9A is a plan view showing a process of forming a conductive shield, and FIG. 9B is a cross-sectional view of a main portion thereof;

FIG. 10A is a plan view showing a dividing process, and FIG. 10B is a cross-sectional view of a main portion thereof.

DETAILED DESCRIPTION OF THE EMBODIMENTS

Figure 1:
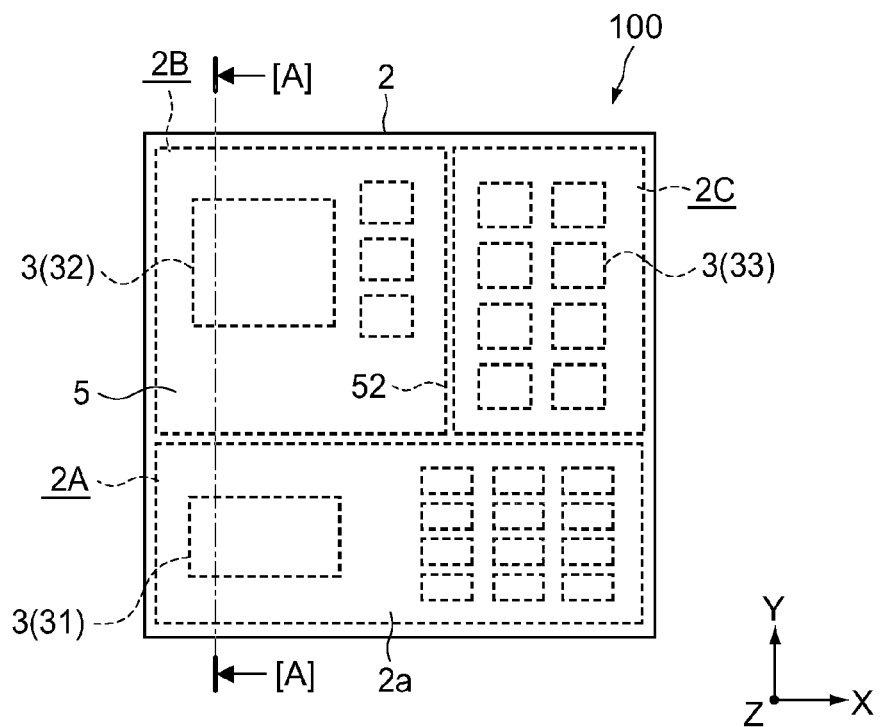
FIG. 1 is a plan view of a circuit module according to a first embodiment of the present disclosure.

A circuit module according to an embodiment of the present disclosure includes a wiring substrate, a plurality of electronic components, an insulating sealing layer, and a conductive shield.

The wiring substrate has a mount surface, a conductor pattern, and an insulating protective layer, the mount surface having a first area and a second area, the conductor pattern being formed along a boundary between the first area and the second area on the mount surface, the insulating protective layer being formed on the mount surface, the insulating protective layer covering the mount surface and the conductor pattern.

The plurality of electronic components are mounted on the first area and the second area.

The insulating sealing layer has a trench, the insulating sealing layer covering the plurality of electronic components, the trench having a depth such that the trench penetrates the protective layer to reach a surface of the conductive pattern.

The conductive shield has a first shield portion and a second shield portion, the first shield portion covering an outer surface of the sealing layer, the second shield portion being electrically connected to the conductor pattern.

The sealing layer has the trench having a depth such that the trench penetrates the protective layer to reach the surface of the conductor pattern. Because the trench is typically formed by laser processing, and the conductor pattern is covered by the protective layer, the laser beam penetrates the protective layer to reach the surface of the conductor pattern. At this time, the material forming the protective layer includes a little amount of filler component or no filler component. Therefore, only a little amount of smear (residue of resin) occurs on the conductor pattern after irradiation of laser.

Accordingly, it is possible to ensure reliable electrical connection between the conductor pattern and the second shield portion without performing desmear processing being a later process.

The protective layer may have a first thickness right above the conductor pattern, the sealing layer may have a second thickness right above the conductor pattern, and the trench may have a depth equal to the sum of the first thickness and the second thickness.

The inner peripheral wall surface of the trench may have a first inner peripheral wall surface including the material of the sealing layer and a second inner peripheral wall surface including the material of the protective layer.

The conductor pattern may include Cu. Accordingly, in the case where the trench is formed by using a laser beam such as a $CO_2$ laser, it is possible to reduce damage on the conductor pattern due to irradiation of laser beam without protecting the surface of the conductor pattern because Cu has a low absorption rate of a $CO_2$ laser.

The conductor pattern may have a first metal layer including Cu and a second metal layer including Au or Ag, which is formed on the surface of the first metal layer. Accordingly, in the case where, for example, a laser beam having a wavelength at which Au or Ag has higher reflectance properties and lower absorption properties than other metals (e.g., 500 nm or more) is used to form the trench, it is possible to reduce damage on the first metal layer due to irradiation of laser beam.

The conductor pattern may have a third metal layer including a metal material having a melting point higher than Cu, which is disposed between the first metal layer and the second metal layer. Accordingly, the heat resistance of the conductor pattern is improved, and it is possible to protect the first metal layer by the third metal layer even in the case where the second metal layer is burned out due to irradiation of laser beam.

The trench may be formed by laser processing. As the laser beam, various laser beams such as a gas laser, a solid laser, and a semiconductor laser, which are used as a laser for processing, can be employed. Typically, an Nd:YAG laser, an Nd:YVO$_4$ laser, a $CO_2$ laser, or the like is employed. Accordingly, the trench can be formed in an arbitrary shape.

A method of producing a circuit module according to an embodiment of the present disclosure includes preparing a wiring substrate on which a conductor pattern is formed on a mount surface having a first area and a second area, the conductor pattern being formed along a boundary between the first area and the second area.

A protective layer is formed on the mount surface, the protective layer including an insulating material, the protective layer covering the mount surface and the conductor pattern;

A plurality of electronic components are formed on the first area and the second area.

A sealing layer is formed on the mount surface, the sealing layer including an insulating material, the sealing layer covering the plurality of electronic components.

By applying a laser beam to a surface of the sealing layer, a trench having a depth such that the trench penetrates the protective layer to reach a surface of the conductive pattern is formed.

A conductive shield is formed by filling conductive resin in the trench and covering an outer surface of the sealing layer with the conductive resin.

According to the above-mentioned method of producing a circuit module, a laser beam is applied to the surface of the sealing layer, and the laser beam penetrates the sealing layer and the protective layer, thereby forming a trench having a depth ranging from the upper surface of the sealing layer to the surface of the conductor pattern.

Accordingly, because the laser beam reaches the surface of the conductor pattern after penetrating the protective layer including a little amount of filler component or no filler component as compared with the material forming the sealing layer, only a little amount of smear (residue of resin) occurs on the conductor pattern after irradiation of laser. Accordingly, it is possible to ensure reliable electrical connection between the conductor pattern and the second shield portion without performing desmear processing being a later process.

In the process of forming the trench, it is possible to form the trench by applying a $CO_2$ laser beam to the surface of the sealing layer. The $CO_2$ laser beam has a wavelength larger than a typical laser beam and thus has a relatively low absorption rate with respect to metal. Accordingly, it is possible to reduce damage on the conductor pattern due to irradiation of laser beam without protecting the surface of the conductor pattern. In particular, in the case where the surface of the conductor pattern includes Cu having a low absorption rate of $CO_2$ laser, it is possible to significantly reduce damage on the conductor pattern.

Hereinafter, embodiments according to the present disclosure will be described with reference to the drawings.

First Embodiment

Figure 2:
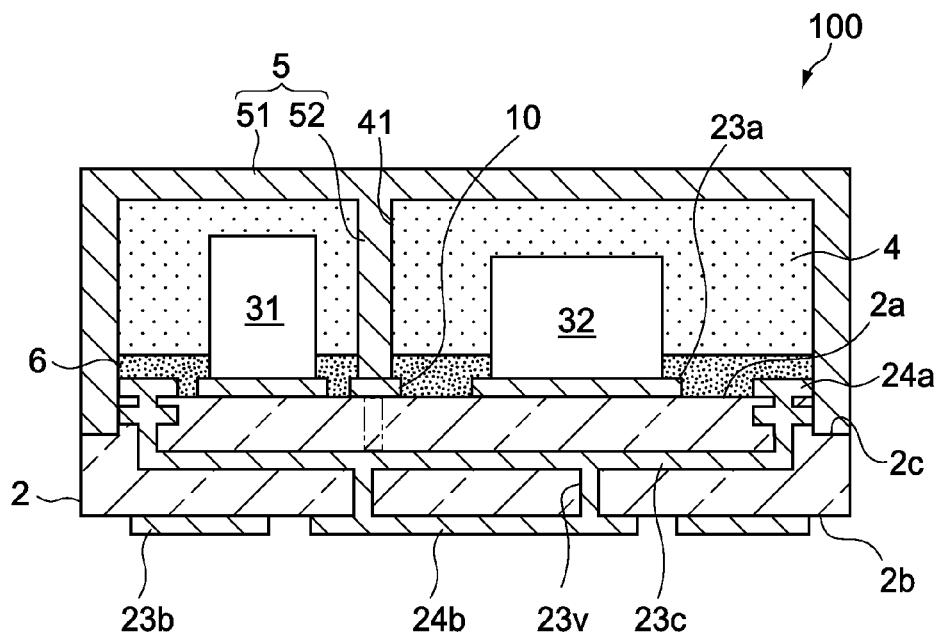
FIG. 2 is a cross-sectional view taken along the direction of line A-A of FIG. 1.
Figure 3:
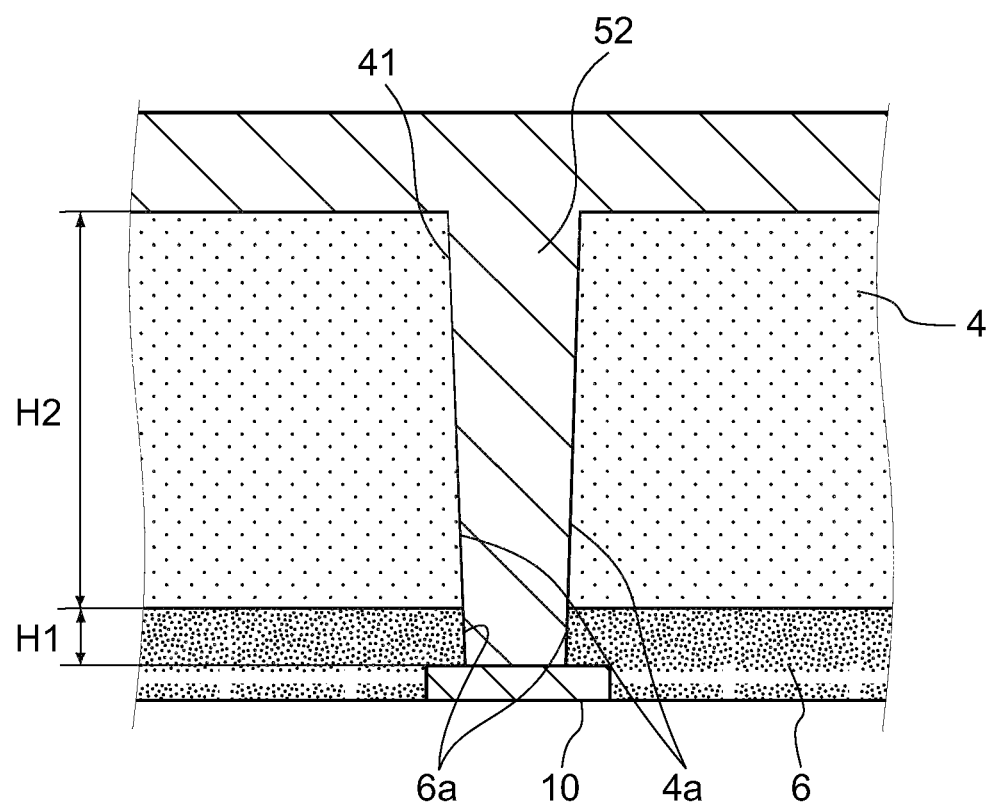
FIG. 3 is an enlarged cross-sectional view of a main portion of the circuit module.

FIGS. 1 to 3 are each a diagram showing a circuit module according to a first embodiment of the present disclosure. FIG. 1 is a top view, FIG. 2 is a cross-sectional view taken along the direction of line A-A of FIG. 1, and FIG. 3 is an enlarged cross-sectional view of FIG. 2.

It should be noted that in each figure, X-, Y-, and Z-axes represent triaxial directions orthogonal to each other, and the Z-axis direction corresponds to the thickness direction of the circuit module. It should be noted that the configuration of each portion is exaggeratingly shown in order to facilitate understanding, and the sizes of the members or the ratios of the sizes of the members do not necessarily correspond to each other in the figures.

[Configuration of Circuit Module]

A circuit module 100 according to this embodiment includes a wiring substrate 2, a plurality of electronic components 3 (31 to 33), a sealing layer 4, and a conductive shield 5.

The circuit module 100 is formed in a substantially rectangular parallelepiped shape as a whole. The size of the circuit module 100 is not particularly limited, and the circuit module 100 is formed to have the length of 10 to 50 mm along the X-axis direction and the length of 10 to 50 mm along the Y-axis direction, for example. In this embodiment, the circuit module 100 is formed to have a substantially square shape having a side length of about 35 mm. Moreover, also the thickness of the circuit module 100 is not particularly limited, and the circuit module 100 is formed to have the thickness of 1 to 3 mm. In this embodiment, the circuit module 100 is formed to have the thickness of about 2 mm.

In the circuit module 100, a protective layer 6 is formed so as to cover a mount surface 2a on the wiring substrate 2 and an upper layer wiring pattern 23a, the plurality of electronic components 3 are disposed, and the sealing layer 4 and the conductive shield 5 are formed so as to cover them. Hereinafter, the configuration of the respective portions of the circuit module 100 will be described.

(Wiring Substrate)

The wiring substrate 2 includes the mount surface 2a formed to have a substantially square shape, which has the same size as the entire circuit module 100, for example, and a terminal surface 2b formed on the opposite side of the mount surface 2a. The wiring substrate 2 includes a glass epoxy multilayer wiring substrate having the thickness of about 0.4 mm, for example. The material forming the insulating layer of the wiring substrate 2 is not limited to the above-described glass epoxy material, and an insulating ceramic material can be employed, for example.

The wiring layer of the wiring substrate 2 typically includes a conductive material such as Cu, and is disposed on the surface, rear surface, and inner layer of the wiring substrate 2. The wiring layer is subjected to patterning into a predetermined shape to form the upper layer wiring pattern 23a disposed on the mount surface 2a, a lower layer wiring pattern 23b disposed on the terminal surface 2b, and an inner layer wiring pattern 23c disposed therebetween. The upper layer wiring pattern 23a includes a land portion on which the electronic component 3 is mounted, and a conductor pattern 10 connected to a second shield portion 52 (conductive shield 5). The lower layer wiring pattern 23b includes an external connection terminal connected to a control substrate (an illustration omitted) of the electronic apparatus on which the circuit module 100 is mounted. The layers of the wiring layer are electrically connected to each other via a via conductor 23v.

Moreover, the above-mentioned wiring layer includes a first GND terminal 24a and a second GND terminal 24b, which are connected to a ground (GND) potential. The first GND terminal 24a is disposed adjacent to an uneven surface 2c formed around the upper surface of the wiring substrate 2, and is connected to the inner surface of a first shield portion 51 (conductive shield 5) disposed on the uneven surface 2c. The first GND terminal 24a may be formed as a part of the upper layer wiring pattern 23a, or a part of the inner layer wiring pattern 23c.

The second GND terminal 24b is connected to the first GND terminal 24a via the inner layer wiring pattern 23c. The second GND terminal 24b is formed as a part of the lower layer wiring pattern 23b, and is connected to a ground wiring of the above-mentioned control substrate.

The mount surface 2a is divided into a plurality of areas by the second shield portion 52 (conductive shield 5), and includes a first area 2A, a second area 2B, and a third area 2C, in this embodiment. In the example shown in FIG. 1, the first to third areas 2A to 2C are formed to have different sizes and different rectangular shapes. However, the areas 2A to 2C may be formed to have another polygon shape such as a triangular shape and a pentagonal shape, a circular shape, or an arbitrary geometric shape such as an elliptical shape. Moreover, the number of areas partitioned on the mount surface 2a is not limited to three, and may be two or not less than four.

The conductor pattern 10 forms a part of the upper layer wiring pattern 23a, and typically includes a conductive material such as Cu. In this embodiment, the conductor pattern 10 includes Cu. Accordingly, in the case where a trench 41 to be described later is formed, if a laser beam such as a $CO_2$ laser is used, it is possible to reduce damage on the conductor pattern 10 due to the laser beam by Cu having properties of low absorption rate of $CO_2$ laser without protecting the surface of the conductor pattern 10.

The conductor pattern 10 is formed along the boundary between the areas on the mount surface 2a, and is electrically connected to the second shield portion 52. The thickness of the conductor pattern 10 is not particularly limited, and the conductor pattern 10 has a thickness of 10 to 15 μm, for example. The conductor pattern 10 is connected to the second GND terminal 24b on the terminal surface 2b via the via conductor 23v and the inner layer wiring pattern 23c.

The mount surface 2a and the upper layer wiring layer are covered by a liquid insulating material and subjected to patterning to form the protective layer 6. To the protective layer 6, a land for mounting the electronic component 3 is exposed. The protective layer 6 includes an insulating material having a low silica component as compared with the material forming the sealing layer 4, and typically includes a photosensitive resin material such as a solder resist containing no filler, or a non-photosensitive resin material. Accordingly, it is possible to reduce the amount of smear remaining on the surface of the conductor pattern 10 during the forming of the trench 41 to be described later.

(Electronic Component)

The plurality of electronic components 3 are mounted on the first, second, and third areas 2A to 2C on the mount surface 2a. Typically, examples of the plurality of electronic components 3 include various components such as an integrated circuit (IC), a capacitor, an inductor, a resistor, a crystal oscillator, a duplexer, a filter, and a power amplifier.

These components include components that generate an electromagnetic wave around them during operation or components liable to be affected by the electromagnetic wave. Typically, these components are mounted on different areas partitioned by the second shield portion 52 (conductive shield 5). Hereinafter, the electronic component 3 and the plurality of electronic components 3 mounted on the first area 2A are also referred to as electronic component 31, and the electronic component 3 and the plurality of electronic components 3 mounted on the second area 2B are also referred to as electronic component 32. Then, the electronic component 3 and the plurality of electronic components 3 mounted on the third area 2C are also referred to as electronic component 33.

The plurality of electronic components 3 are typically mounted on the mount surface 2a by soldering, an adhesive, an anisotropy adhesive sheet, a bonding wire, or the like.

(Sealing Layer)

The sealing layer 4 includes an insulating material formed on the mount surface 2a so as to cover the plurality of electronic components 31 and 32 and the protective layer 6. The sealing layer 4 is divided into a first area 2A side, a second area 2B side, and a third area 2C side by the second shield portion 52 provided in the trench 41. In this embodiment, the sealing layer 4 typically includes insulating resin such as epoxy resin to which silica or alumina is added. The method of forming the sealing layer 4 is not particularly limited, and the sealing layer 4 is formed by a molding method, for example.

The trench 41 is formed along the height direction (Z-axis direction) from the upper surface of the sealing layer 4 to have a predetermined depth. Typically, the trench 41 is formed to have a depth such that the bottom surface of the trench 41 penetrates the sealing layer 4 and the protective layer 6 to reach the surface of the conductor pattern 10. In this embodiment, as shown in FIG. 3, the trench 41 has a depth equal to a sum of a thickness H1 of the protective layer 6 right above the conductor pattern 10 (first thickness) and a thickness H2 of the sealing layer 4 right above the conductor pattern 10 (second thickness). Moreover, the trench 41 has a first inner peripheral wall surface 4a including the material of the sealing layer 4 and a second inner peripheral wall surface 6a including the material of the protective layer 6.

The method of forming the trench 41 is not particularly limited. However, in this embodiment, the trench 41 is formed by a laser processing technique. The laser for processing is not particularly limited. However, in this embodiment, a $CO_2$ laser (having a wavelength of 10640 nm) is used as the laser for processing.

(Conductive Shield)

The conductive shield 5 includes the first shield portion 51 and the second shield portion 52. The first shield portion 51 is formed so as to cover the outer surface (surface including the upper surface and side surface of the sealing layer 4; the same shall apply hereinafter) of the sealing layer 4, and functions as the exterior shield of the circuit module 100. The second shield portion 52 is provided in the trench 41 of the sealing layer 4, and functions as the interior shield of the circuit module 100.

The conductive shield 5 includes a cured conductive resin material filled in the outer surface of the sealing layer 4 and the trench 41. More specifically, epoxy resin to which conductive particles such as Ag and Cu are added is employed. Alternatively, the conductive shield 5 may include a plating film or a sputtering film deposited in the outer surface of the sealing layer 4 and the inner wall of the trench 41.

With such a configuration, it is possible to form the first shield portion 51 and the second shield portion 52 in the same process. Moreover, it is possible to form the first shield portion 51 and the second shield portion 52 integrally.

[Method of Producing Circuit Module]

Next, a method of producing the circuit module 100 according to this embodiment will be described.

FIGS. 4 to 10 are diagrams for explaining the method of producing the circuit module 100. Moreover, in each of FIGS. 5 to 10, A is a top view, and B is a cross-sectional view of a main portion viewed from the X-axis direction. The method of producing the circuit module according to this embodiment includes a process of preparing an aggregate substrate, a process of mounting an electronic component, a process of forming a sealing layer, a half-cutting process, a process of forming a trench, a process of forming a conductive shield, and a cutting process. Hereinafter, each process will be described.

(Process of Preparing Aggregate Substrate)

Figure 4:
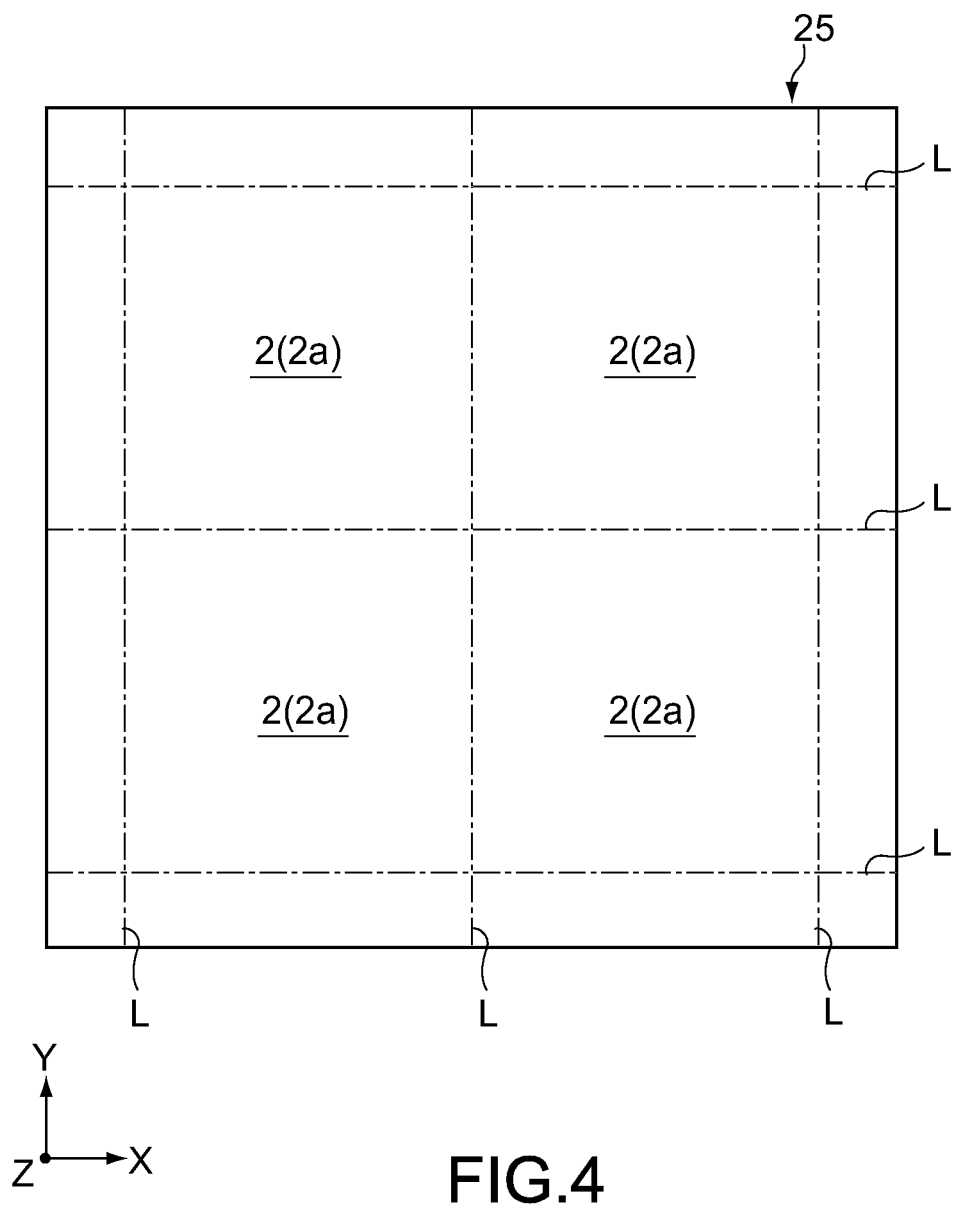
FIG. 4 is a diagram for explaining a method of producing the above-mentioned circuit module.

FIG. 4 is a top view schematically showing the configuration of an aggregate substrate 25. The aggregate substrate 25 includes a substrate with a large area on which a plurality of wiring substrates 2 are attached. FIG. 4 shows separation lines L dividing the plurality of wiring substrates 2. The separation line L may be a virtual line, and drawn on the aggregate substrate 25 actually by printing or the like.

A liquid insulating material is applied to the mount surface of the wiring substrate 2 and the upper layer wiring layer, and is subjected to patterning after being pre-baked. Thus, the insulating material on the land portion for mounting the electronic component 3 is partially removed. The patterned insulating material is post-baked and cured, and thus, the protective layer 6 is formed. The patterning of the insulating material can be performed by a photolithography technique.

On the aggregate substrate 25, the conductive shield 5 is finally formed through each process to be described later. In the cutting process being the last process, the aggregate substrate 25 is cut (full-cut) along the separation line L to produce a plurality of circuit modules 100. Moreover, although not shown, in the aggregate substrate 25, a predetermined wiring pattern is formed for each area forming the wiring substrate 2.

It should be noted that in the example shown in FIG. 4, an example in which four wiring substrates 2 are cut from the aggregate substrate 25 is shown. The number of wiring substrates 2 to be cut is not particularly limited. For example, in the case where a substrate formed to have a substantially square shape of about 150 mm square is used as the aggregate substrate 25, four wiring substrates 2 of about 35 mm square are arranged in the X-axis direction and the Y-axis direction, i.e. sixteen wiring substrates 2 are arranged. Moreover, as the aggregate substrate 25, a substrate having a rectangular shape 100 to 200 mm on a side is typically used.

(Process of Mounting Electronic Component)

Figure 5A:
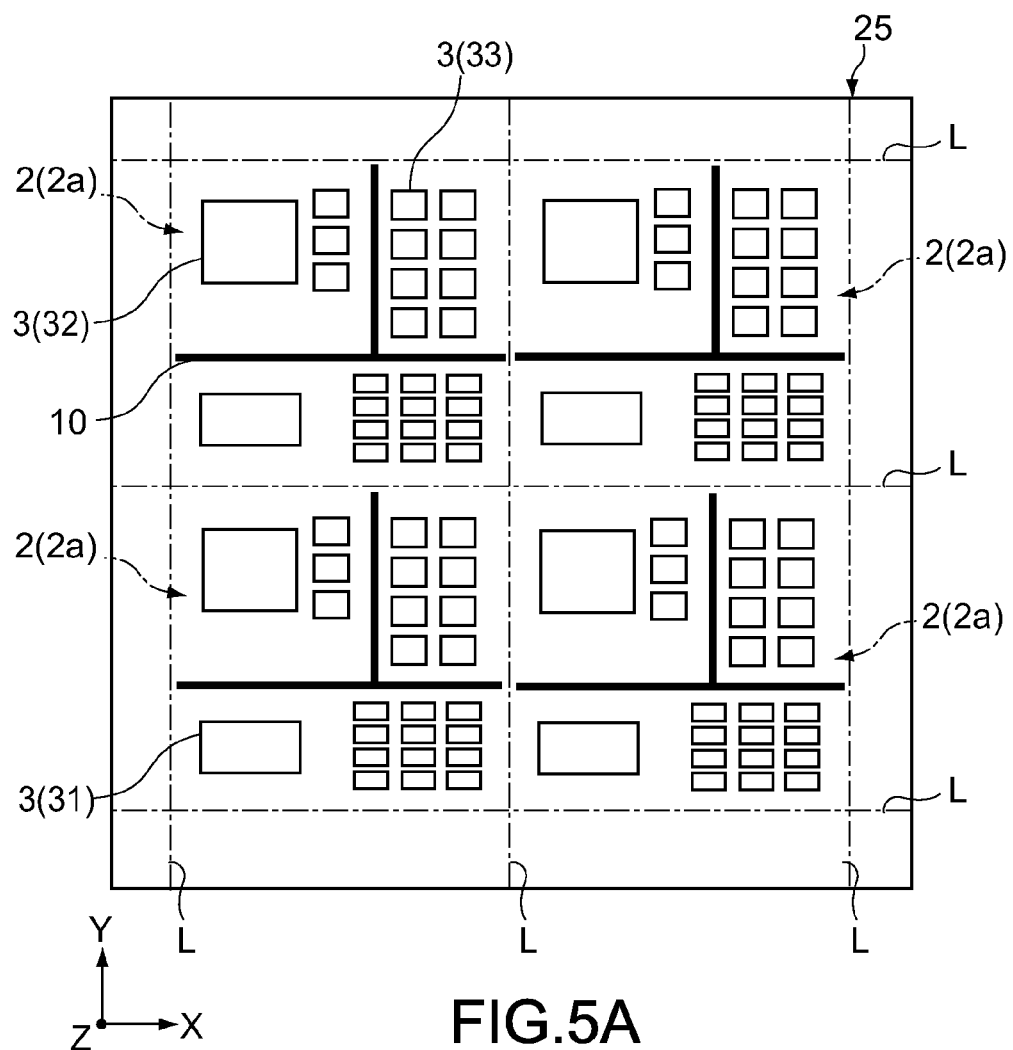
FIGS. 5A and 5B are each a diagram for explaining the method of producing the above-mentioned circuit module.
Figure 5B:
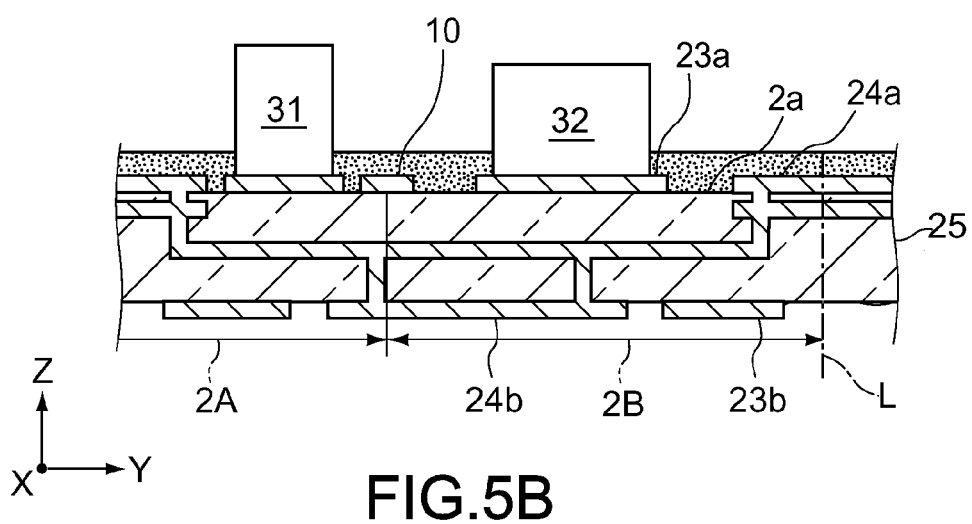

FIGS. 5A and 5B are diagrams for explaining a process of mounting the electronic components 3 (31 to 33), and show a mode in which the electronic components 31 to 33 are disposed on the aggregate substrate 25 (wiring substrate 2).

In this process, the plurality of electronic components 31 to 33 are mounted on the first area 2A, the second area 2B, and the third area 2C on the mount surface 2a. As the method of mounting the electronic components 31 to 33, a reflow process is employed, for example. Specifically, first, a soldering paste is applied to a predetermined land portion on the mount surface 2a by a screen printing method or the like. Next, the plurality of electronic components 31 to 33 are mounted on the predetermined land portion via the soldering paste. After that, the aggregate substrate 25 on which the electronic components 31 to 33 are mounted is put in a reflow furnace, and the electronic components 31 to 33 are electrically and mechanically bonded to the mount surface 2a by performing a reflow process on the soldering paste.

(Process of Forming Sealing Layer)

Figure 6A:
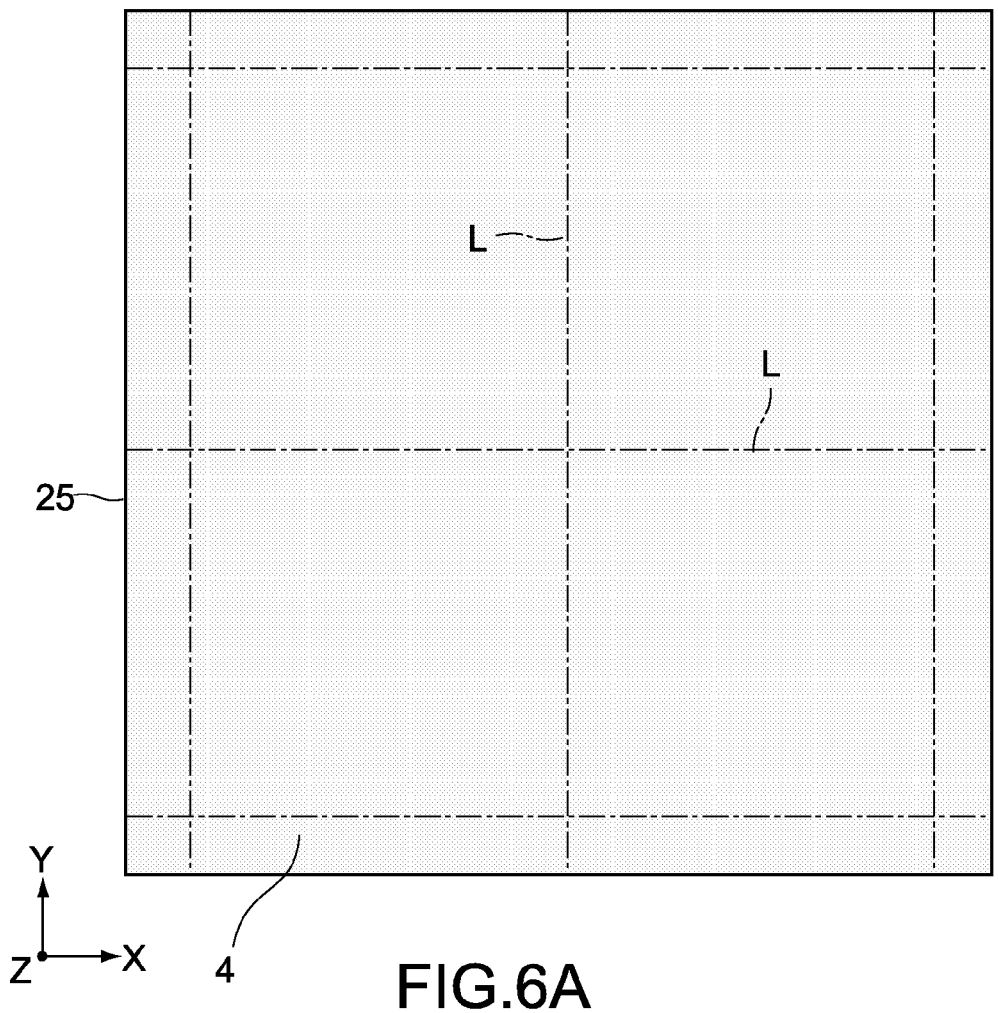
FIGS. 6A and 6B are each a diagram for explaining the method of producing the above-mentioned circuit module.
Figure 6B:
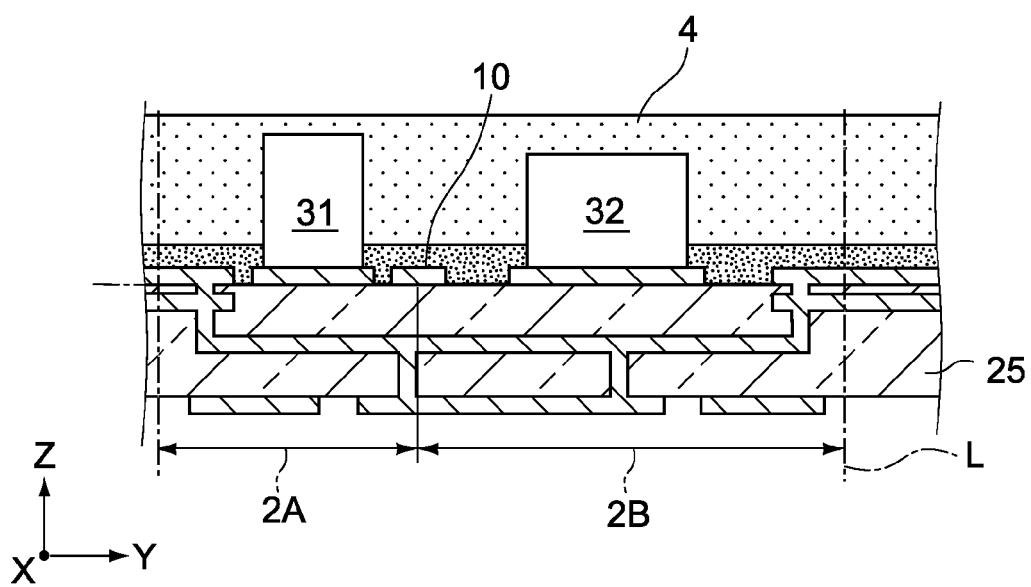

FIGS. 6A and 6B are diagrams for explaining a process of forming the sealing layer 4, and show a mode in which the sealing layer 4 is formed on the mount surface 2a.

The sealing layer 4 is formed on the mount surface 2a of the aggregate substrate 25 so as to cover the plurality of electronic components 31 to 33. The method of forming the sealing layer 4 is not particularly limited, and a molding method using a mold, a potting molding method using no mold, or the like can be applied, for example. Moreover, after a liquid or paste sealing resin material is applied to the mount surface 2a by a spin coating method or a screen printing method, heat treatment may be applied on it to be cured.

(Half-Cut Process)

Figure 7A:
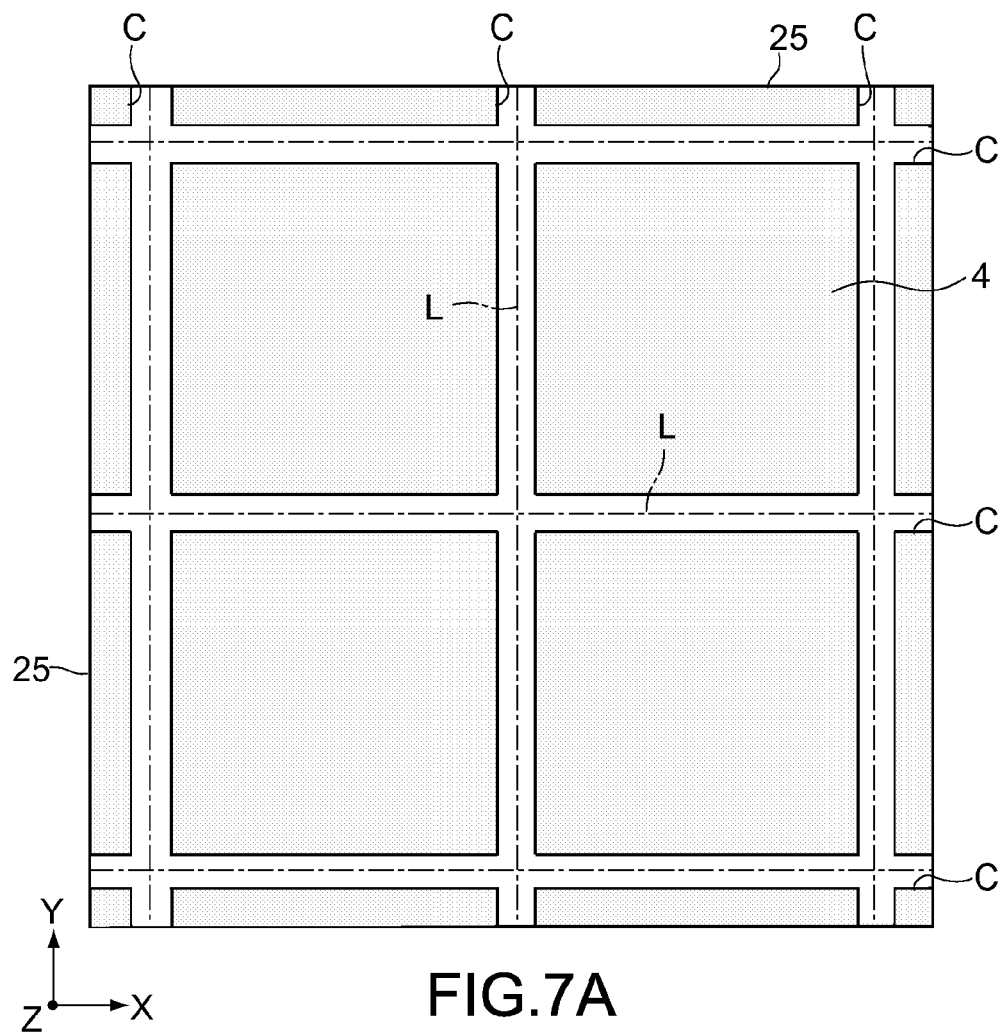
FIGS. 7A and 7B are each a diagram for explaining the method of producing the above-mentioned circuit module.
Figure 7B:
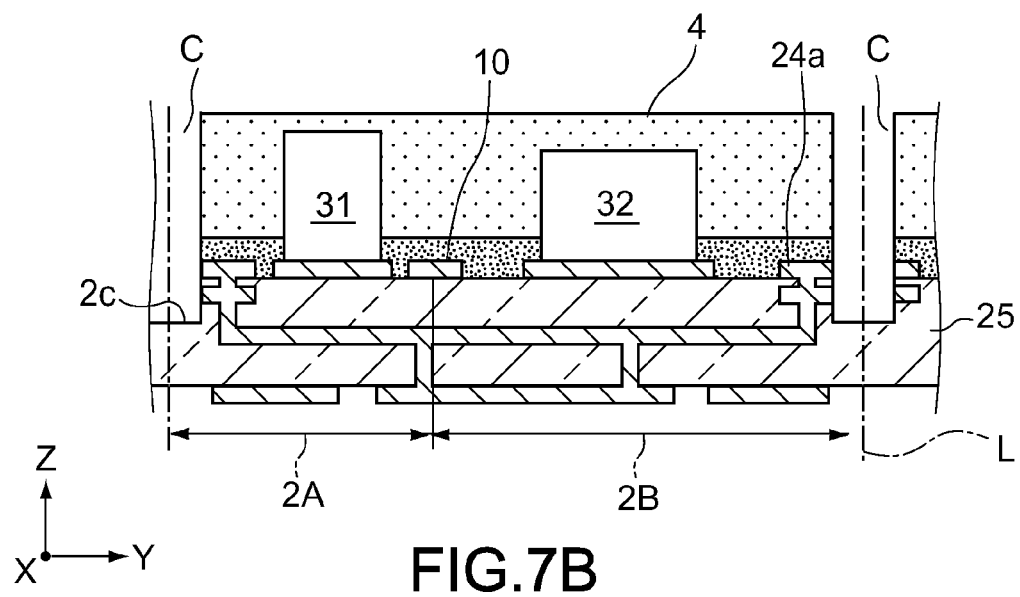

FIGS. 7A and 7B are diagrams for explaining a half-cut process. In this process, cut grooves C are formed along the separation line L to have a depth ranging from the upper surface of the sealing layer 4 to the inside of the aggregate substrate 25 by a dicer, for example. The cut groove C forms the uneven surface 2c of the aggregate substrate 25 (wiring substrate 2). The depth of the cut groove C is not particularly limited. However, the cut groove C is formed to have a depth such that the first GND terminal 24a on the aggregate substrate 25 can be divided.

(Process of Forming Trench)

Figure 8A:
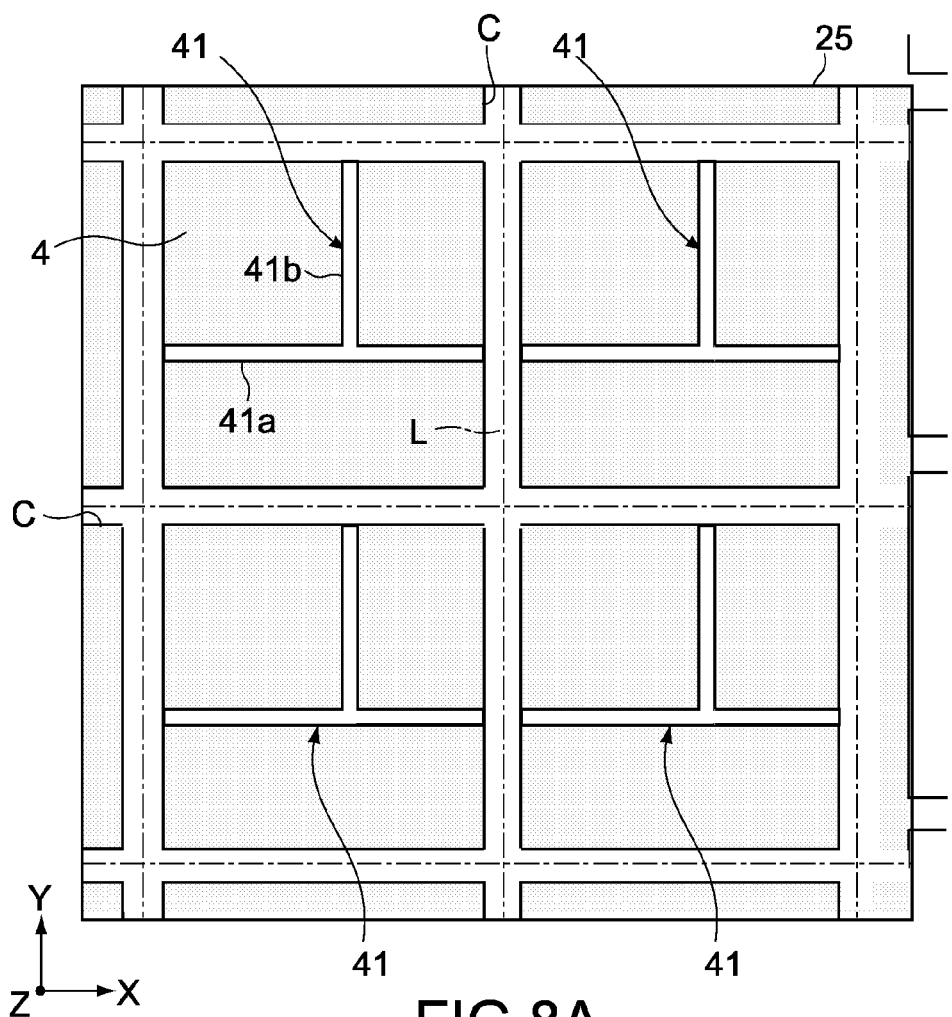
FIGS. 8A and 8B are each a diagram for explaining the method of producing the above-mentioned circuit module.
Figure 8B:
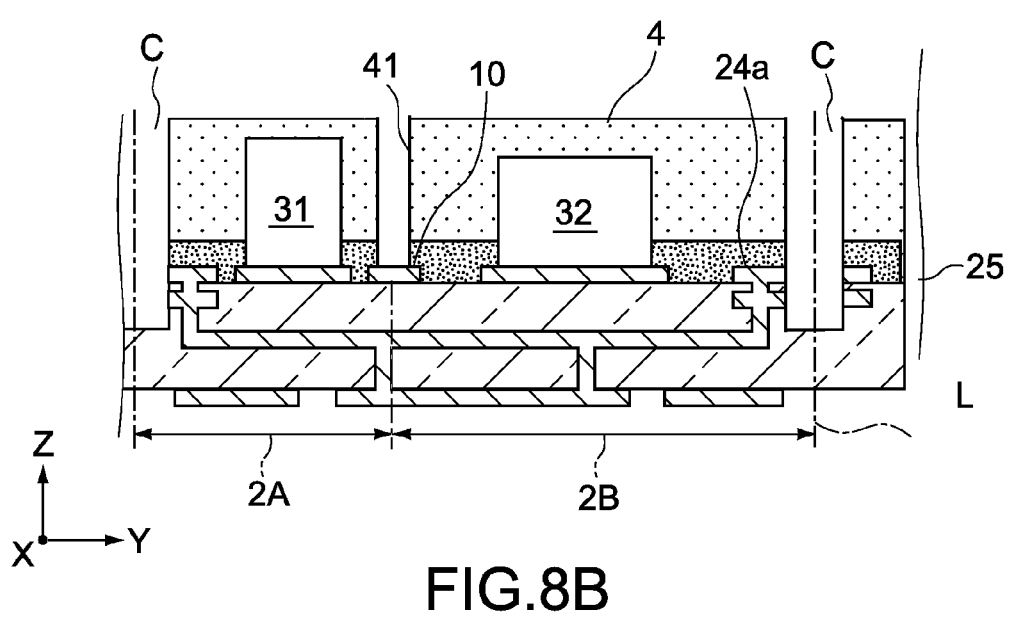

FIGS. 8A and 8B are diagrams for explaining a process of forming the trench 41. The trench 41 is formed along the boundary between the areas 2A to 2C on the mount surface 2a. Specifically, the trench 41 includes a first trench 41a formed along the boundary between the first area 2A and the second and third areas 2B and 2C, and a second trench 41b formed along the boundary between the second area 2B and the third area 2C.

The trench 41 is formed by applying a laser beam. As the laser beam, various laser beams such as a gas laser, a solid laser, and a semiconductor laser, which are used as a laser for processing, can be employed. An Nd:YAG laser, an Nd:YVO$_4$ laser, a CO$_2$ laser, or the like is typically employed, and the CO$_2$ laser is used in this embodiment.

The laser beam may be a continuous wave or a pulse wave. The laser beam is applied, from the side of the upper surface of the sealing layer 4, to the area in which the second shield portion 52 is formed. The resin material of the area to be irradiated with the laser beam is removed by being partially molten or evaporated. In this embodiment, after the laser beam penetrates the protective layer 6, the laser beam reaches the surface of the conductor pattern 10. The material of the protective layer 6 contains fewer silica components than the material of the sealing layer 4. Therefore, only a little amount of smear (residue of resin) occurs on the conductor pattern 10 after irradiation of laser. The laser beam is scanned on the upper surface of the sealing layer 4 at constant power and speed, for example. Thus, the trenches 41 are formed to have almost equal depths. The number of times of scanning is not limited to one, and the scanning may be performed a plurality of times.

The width of the trench 41 is not particularly limited. However, the filling properties of the conductive resin forming the second shield portion 52 is reduced as the width is decreased, and the mounting area of the electronic components 3 is reduced and it is difficult to reduce the size of the module as the width is increased. In this embodiment, the width of the trench 41 is set to 0.05 to 0.3 mm.

The trench 41 is typically formed to have a depth such that the trench 41 penetrates the protective layer 6 from the upper surface of the sealing layer 4 to reach the surface of the conductor pattern 10. Accordingly, the trench 41 having a depth such that the surface of the conductor pattern 10 is exposed to the sealing layer 4 is formed along the boundary between the areas 2A to 2C.

The procedure for forming the trench 41 is not particularly limited. The second trench 41b may be formed after the first trench 41a is formed, or the first trench 41a may be formed after the second trench 41b is formed. Moreover, the trench 41 may be formed prior to the half-cut process.

(Process of Forming Conductive Shield)

Figure 9A:
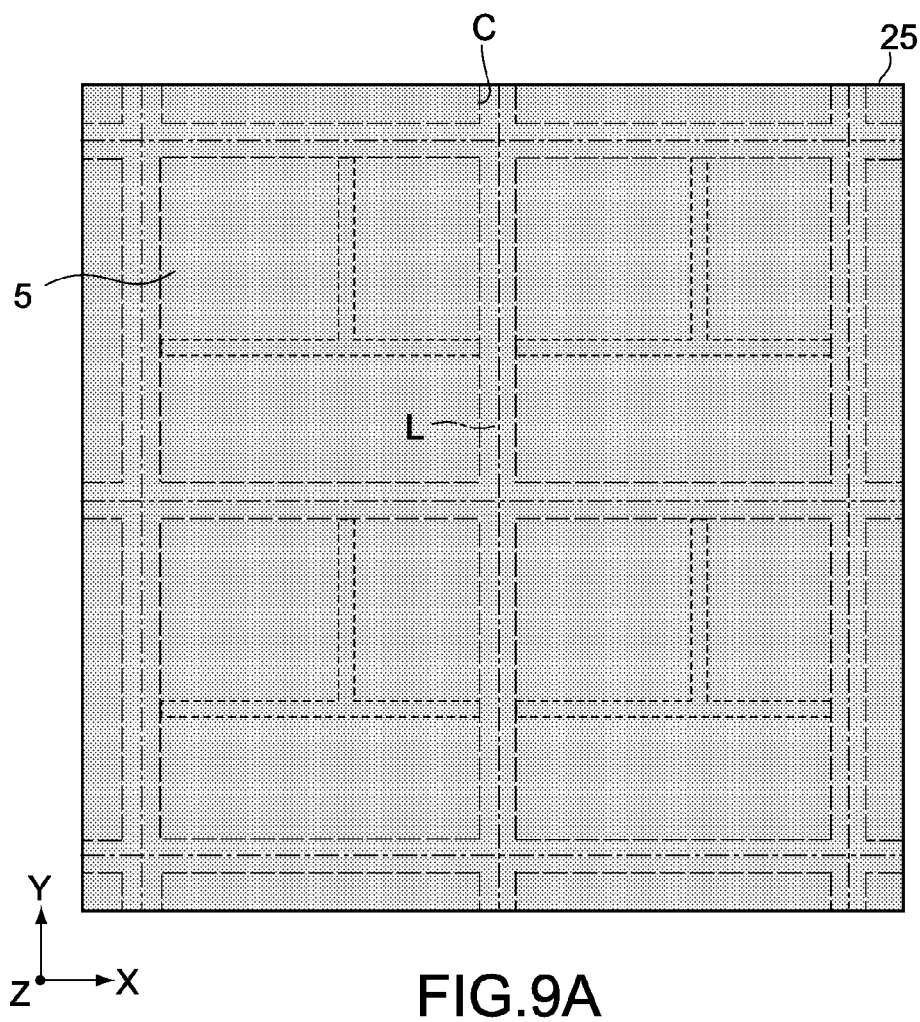
FIGS. 9A and 9B are each a diagram for explaining the method of producing the above-mentioned circuit module.
Figure 9B:
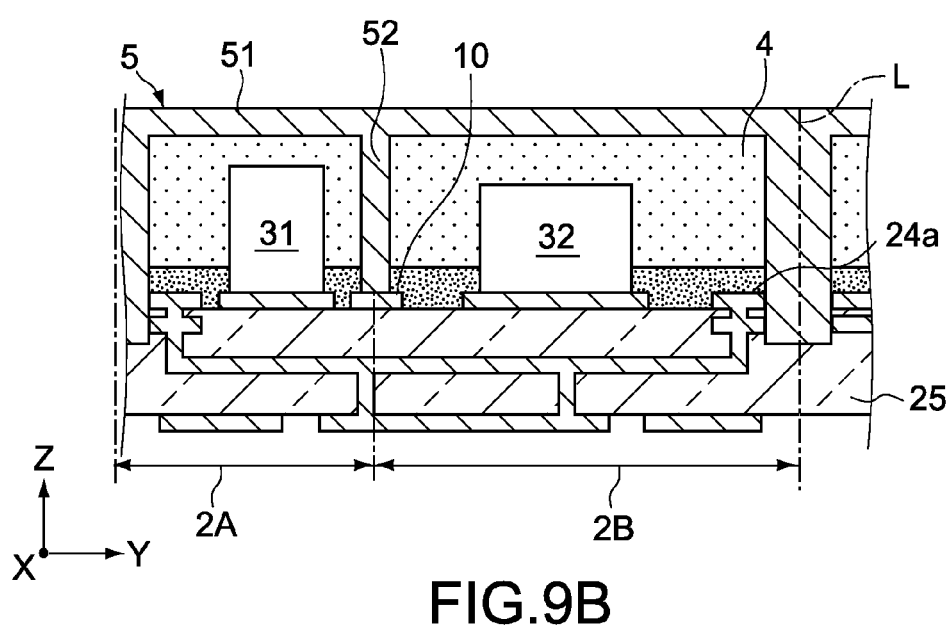

FIGS. 9A and 9B are diagrams for explaining a process of forming the conductive shield 5. The conductive shield 5 is formed on the sealing layer 4. Accordingly, the first shield portion 51 covering the outer surface of the sealing layer 4 and the second shield portion 52 provided on the trench 41 are formed.

In this embodiment, the conductive shield 5 is formed by applying or filling conductive resin or conductive paint to/in the surface of the sealing layer 4. The method of forming the conductive shield 5 is not particularly limited, and a molding method using a mold, a potting molding method using no mold, or the like can be applied, for example. Moreover, after a liquid or paste sealing resin material is applied to the sealing layer 4 by a spin coating method or a screen printing method, heat treatment may be applied on it to be cured.

Moreover, in order to improve the efficiency of filling the conductive material in the trench 41, the process may be performed in a vacuum atmosphere.

The second shield portion 52 is filled in the trench 41 formed in the process of forming the trench. Accordingly, the second shield portion 52 is bonded to the surface of the conductor pattern 10, which is exposed at the bottom of the trench 41. In this embodiment, because the first shield portion 51 and the second shield portion 52 include the same material, electrical conduction between the first shield portion 51 and the second shield portion 52 and a desired joint strength between the shield portions 51 and 52 are ensured.

The forming of the conductive shield 5 may be performed by a vacuum deposition method such as a plating method and a sputtering method. In the plating method, by immersing the aggregate substrate 25 in a plating bath and depositing a plating film on the outer surface of the sealing layer 4 and the inner wall surface of the trench 41, it is possible to form the conductive shield 5. In the sputtering method, by putting the aggregate substrate 25 in a vacuum chamber and sputtering a target including a conductive material to deposit a sputtering film on the outer surface of the sealing layer 4 and the inner wall surface of the trench 41, it is possible to form the conductive shield 5. In this case, there is no need to fill the trench 41 with the plating film or the sputtering film.

(Cutting Process)

Figure 10A:
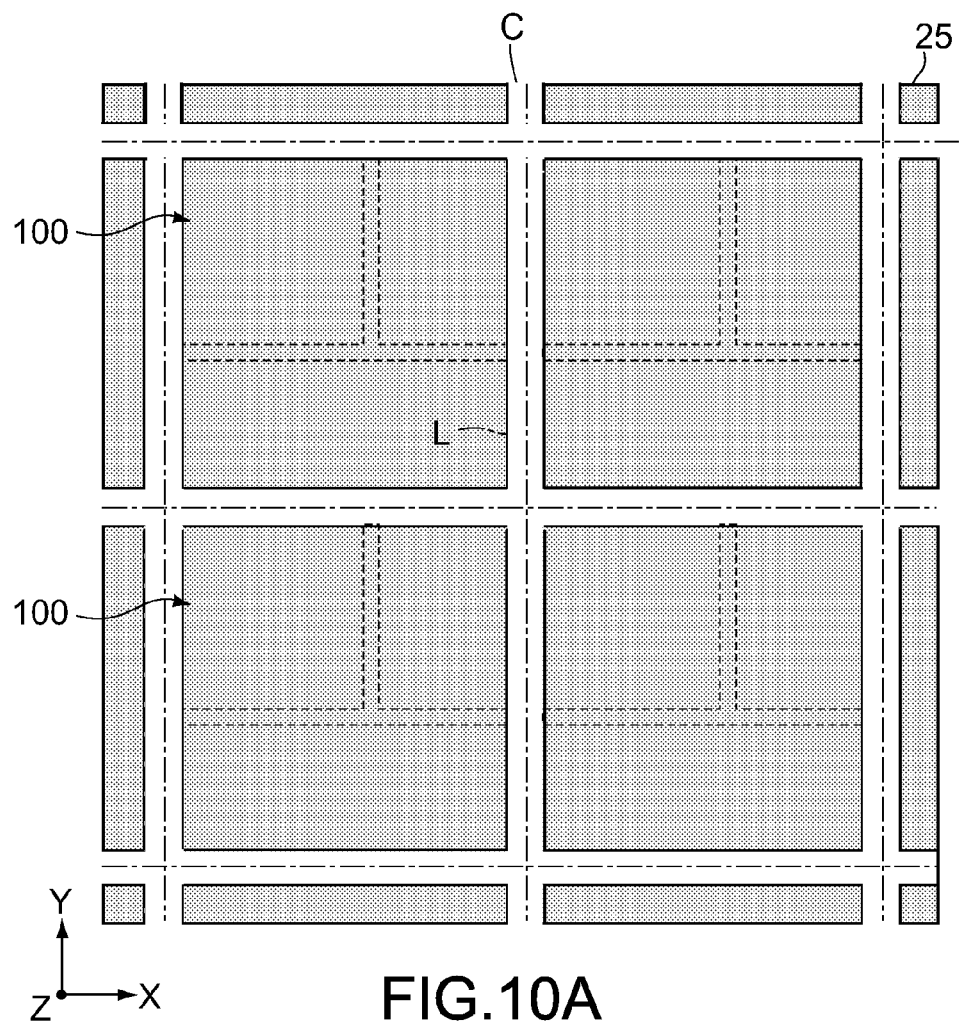
FIGS. 10A and 10B are each a diagram for explaining the method of producing the above-mentioned circuit module.
Figure 10B:
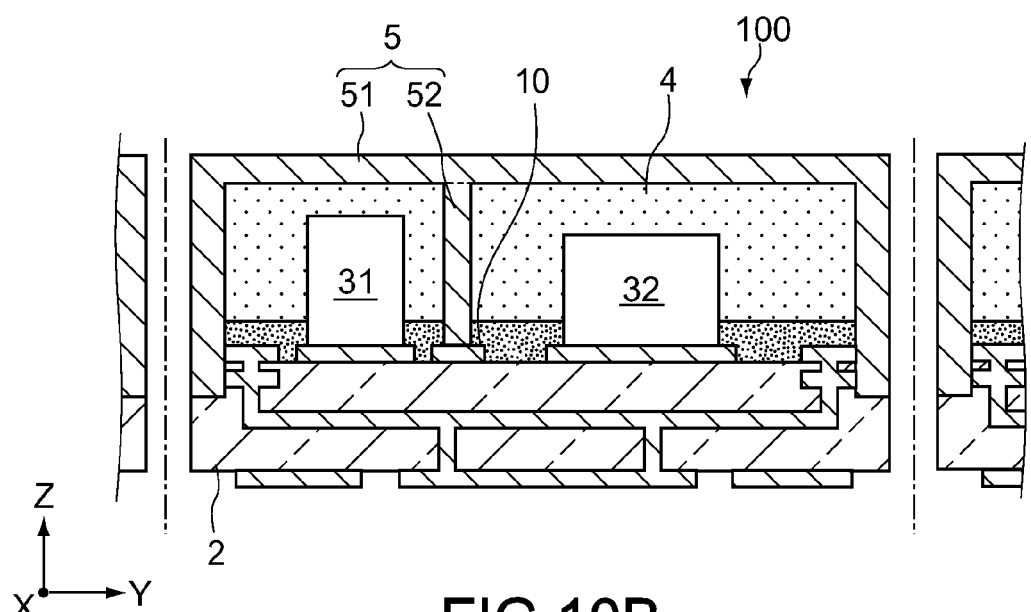

FIGS. 10A and 10B are diagrams for explaining a cutting process. In this process, the aggregate substrate 25 is full-cut along the separation line L, and thus divided into a plurality of circuit modules 100. For the separation, a dicer or the like is used. In this embodiment, because the conductive shield 5 is filled in the cut groove C, the aggregate substrate 25 is separated along the separation line L so that the wiring substrate 2 and the conductive shield 5 (first shield portion 51) have the same cut surface. Accordingly, the circuit module 100 including the conductive shield 5, which covers the surface (upper surface and side surface) of the sealing layer 4 and a part of the side surface of the wiring substrate 2, is produced.

Operation of this Embodiment

Through the above-mentioned processes, the circuit module 100 is produced. According to the method of producing a circuit module according to this embodiment, it is possible to produce the circuit module 100 including the conductive shield 5, which includes the first shield portion 51 preventing an electromagnetic wave from leaking to the outside of the module and from entering from the outside and the second shield portion 52 preventing the plurality of electronic components in the module from electromagnetically interfering with each other.

According to this embodiment, the trench 41 formed in the sealing layer 4 has a depth such that the trench 41 penetrates the protective layer 6 from the upper surface of the sealing layer 4 to reach the surface of the conductor pattern 10. The material forming the protective layer 6 contains fewer silica components such as a silica filler than the material forming the sealing layer 4. Therefore, only a little amount of smear occurs on the conductor pattern 10 after irradiation of laser in the process of forming the trench 41 by laser processing.

Accordingly, it is possible to ensure reliable electrical connection between the conductor pattern 10 and the second shield portion 52 provided in the trench 41 without performing desmear processing being a process for removing smear.

Moreover, in the process of forming the trench 41 according to this embodiment, a $CO_2$ laser beam is employed as a laser beam for processing. The $CO_2$ laser beam has a wavelength larger than a typical laser beam and thus has a relatively low absorption rate with respect to metal. Accordingly, it is possible to reduce damage on the conductor pattern due to irradiation of laser beam without protecting the surface of the conductor pattern. In particular, because the conductor pattern 10 includes Cu having a low absorption rate of $CO_2$ laser in this embodiment, it is possible to significantly reduce damage on the conductor pattern 10.

Moreover, according to this embodiment, because a laser processing method is employed for forming the trench 41 of the sealing layer 4 on which the second shield portion 52 is provided, the trench 41 is formed to have an arbitrary shape (e.g., bent shape, zigzag shape, and curved shape) as compared with the case where the trench 41 is formed by a dicing process. Accordingly, the degree of freedom of designing of the second shield portion 52 is increased.

Second Embodiment

Figure 11:
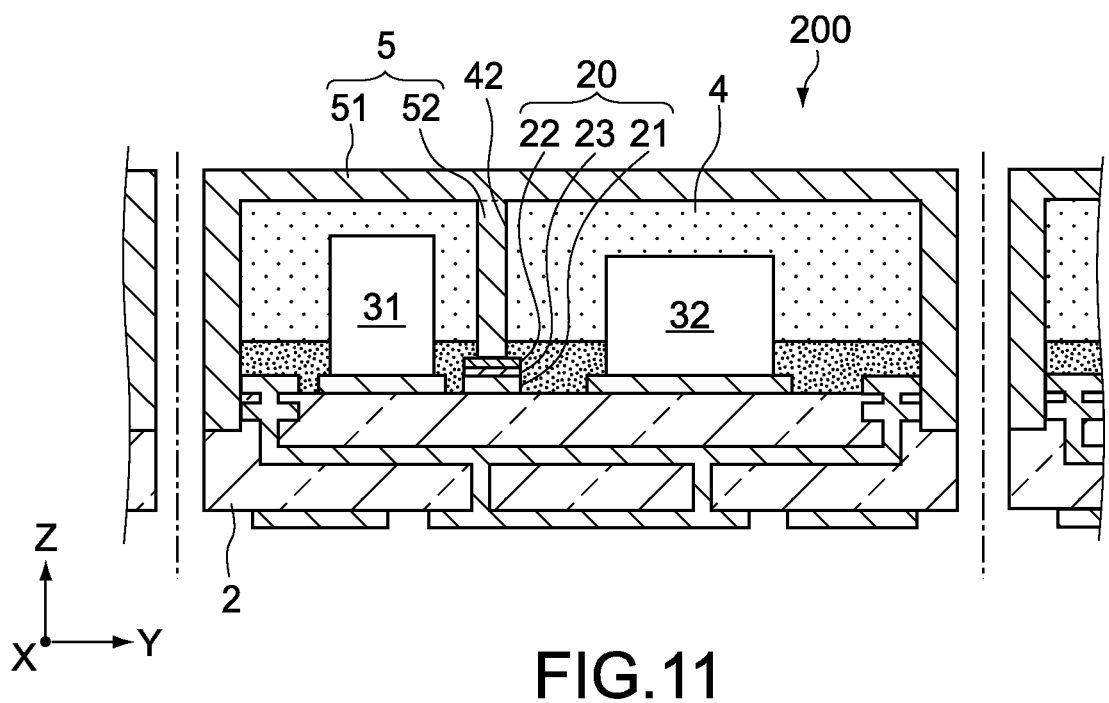
FIG. 11 is a vertical cross-sectional view of a circuit module according to a second embodiment of the present disclosure.

FIG. 11 is a vertical cross-sectional view of a circuit module according a second embodiment of the present disclosure. Hereinafter, the configuration different from that of the first embodiment will be mainly described, and the same configuration as that according to the above-mentioned embodiment will be denoted by the same reference symbols and a description thereof will be omitted or simplified.

A circuit module 200 according to this embodiment has a configuration in which the conductor pattern provided on the mount surface 2a and the trench are different from those in the first embodiment.

As shown in FIG. 11, a conductor pattern 20 according to this embodiment includes a first metal layer 21, a second metal layer 22, and a third metal layer 23. The first metal layer 21 includes Cu, the second metal layer 22 is disposed on the outermost layer of the conductor pattern 20 and includes Au or Ag, and the third metal layer 23 is disposed between the first metal layer 21 and the second metal layer 22 and includes a metal layer having a melting point higher than Cu.

The first metal layer 21 includes Cu and corresponds to the conductor pattern 10 according to the first embodiment.

The second metal layer 22 includes Au or Ag, which has high reflectance properties with respect to a laser beam. The thickness of the second metal layer 22 is not particularly limited, and the second metal layer 22 is formed to have a thickness that can protect the first metal layer 21 against a laser for processing of the trench 41, e.g., 1 to 10 µm.

The third metal layer 23 includes a metal material having a melting point higher than the first metal layer 21 including Cu. For example, the third metal layer 23 includes Ni (nickel), Ti (titanium), Cr (chromium), or the like. The thickness of the third metal layer 23 is not also particularly limited, and is 1 to 10 µm, for example. The third metal layer 23 has a function to improve the heat resistance of the conductor pattern 20 and to protect the first metal layer 21 against irradiation of the laser beam in the case where the second metal layer 22 is burned out due to the irradiation of the above-mentioned laser for processing. It should be noted that the third metal layer 23 may be omitted as necessary.

As shown in FIG. 11, a trench 42 according to this embodiment has a depth such that the trench 42 penetrates the protective layer 6 from the upper surface of the sealing layer 4 to reach the surface of the conductor pattern 20 (surface of the second metal layer 22).

Next, a method of producing the circuit module 200 will be described. It should be noted that because the process of mounting electronic components, the process of forming a sealing layer, the half-cut process, the process of forming a conductive shield, and the cutting process are same as those in the first embodiment, a description thereof will be omitted here.

In this embodiment, the conductor pattern 20 is formed in the process of preparing the aggregate substrate, and the trench 42 is formed in the process of forming the trench.

In the process of preparing the aggregate substrate according to this embodiment, the third metal layer 23 and the second metal layer 22 are laminated in the stated order on the surface of the first metal layer 21 patterned on the mount surface 2a by an electrolytic plating method or the like, and thus, the conductor pattern 20 is formed. Next, a liquid insulating material is applied to the mount surface 2a and the conductor pattern 20, and is cured after being patterned. Thus, the protective layer 6 is formed. In this process, the conductor pattern 20 is covered by the protective layer 6.

Moreover, in the process of forming the trench, after the laser beam applied from the side of the upper surface of the sealing layer 4 penetrates the protective layer 6, the laser beam reaches the surface of the conductor pattern 20. Thus, the trench 42 having a depth ranging from the upper surface of the sealing layer 4 to the surface of the conductor pattern 20 is formed.

In this way, the circuit module 200 is produced. Also in this embodiment, it is possible to achieve the same operation and effect as those in the first embodiment. According to this embodiment, the outermost layer of the conductor pattern 20 leading the second shield portion 52 to the GND terminal includes Au or Ag having high reflectance properties with respect to a laser beam. Therefore, it is possible to effectively protect the first metal layer 21 against laser damage and to protect the first metal layer 21 by the third metal layer 23 having heat resistance higher than the first metal layer 21 even if the second metal layer 22 is cut by the irradiation of laser.

Accordingly, it is possible to reliably and easily form the trench 42 without burning out the first metal layer 21 due to the laser beam. Therefore, it is possible to effectively prevent the conductor pattern 20 from being burned out even if a laser beam such as an Nd:YAG laser having a wavelength shorter than the $CO_2$ laser is used as the laser for processing instead of the $CO_2$ laser.

Moreover, in the case where the conductor pattern 20 is formed, a method of laminating metal in a trench by a plating process, a sputtering method, or the like after a resist material is subjected to patterning into the trench is typically used. In this method, however, because a sealing layer is formed on the surface of the conductor pattern 20 in a later process, smear occurs on the conductor pattern 20 in the process of forming a trench by laser processing.

In this regard, in this embodiment, only a little smear occurs on the conductor pattern 20 and it is possible to ensure reliable electrical connection between the conductor pattern 20 and the second shield portion 52 by covering the conductor pattern 20 with the protective layer 6 after forming the conductor pattern 20 and forming the trench 42 by laser processing.

Although embodiments of the present disclosure have been described, the present disclosure is not limited to the above-mentioned embodiments and various modifications can be made based on the technical ideas of the present disclosure.

For example, in this embodiment, the example in which the wiring substrate 2 includes a print wiring substrate has been described. However, the wiring substrate 2 is not limited thereto, and the wiring substrate may include a semiconductor substrate such as a silicon substrate. Moreover, the electronic component 3 may include various actuators such as MEMS (Micro Electro Mechanical System) components.

What is claimed is:

1. A circuit module, comprising:
a wiring substrate having a mount surface, a conductor pattern, and an insulating protective layer, the mount surface having a first area and a second area, the conductor pattern being formed along a boundary between the first area and the second area on the mount surface, the insulating protective layer being formed on the whole area of the mount surface, the conductor pattern including a first metal layer and a second metal layer having a laser reflectance property higher than that of the first metal layer being formed on a surface of the first metal layer, the insulating protective layer covering the mount surface and the conductor pattern;
a plurality of electronic components mounted on the first area and the second area;
an insulating sealing layer having a trench, the insulating sealing layer covering the plurality of electronic components and the protective layer, the trench having a depth such that the trench penetrates the protective layer to reach a surface of the conductor pattern; and
a conductive shield having a first shield portion and a second shield portion, the first shield portion covering an outer surface of the sealing layer, the second shield portion being electrically connected to the conductor pattern.

2. The circuit module according to claim 1, wherein
the protective layer has a first thickness right above the conductor pattern,
the sealing layer has a second thickness right above the conductor pattern, and
the trench has a depth equal to a sum of the first thickness and the second thickness.

3. The circuit module according to claim 1, wherein
an inner peripheral wall surface of the trench has
a first inner peripheral wall surface including a material of the sealing layer, and
a second inner peripheral wall surface including a material of the protective layer.

4. The circuit module according to claim 1, wherein
the first metal layer includes Cu, and
the second metal layer includes one of Au and Ag.

5. The circuit module according to claim 4, wherein
the conductor pattern further has a third metal layer disposed between the first metal layer and the second metal layer, and
the third metal layer includes a metal material having a melting point higher than Cu.

6. The circuit module according to claim 1, wherein
the trench is formed by laser processing.

7. The circuit module according to claim 1, wherein
the sealing layer includes a resin material containing a filler.

* * * * *